US005420054A

United States Patent [19]

Choi et al.

[11] Patent Number: 5,420,054

[45] Date of Patent: May 30, 1995

[54] METHOD FOR MANUFACTURING FIELD EMITTER ARRAY

[75] Inventors: Sun-jeong Choi; Gang-ok Lee, both of Suwon, Rep. of Korea

[73] Assignee: Samsung Display Devices Co., Ltd., Hwaseong-gun, Rep. of Korea

[21] Appl. No.: 276,468

[22] Filed: Jul. 18, 1994

[30] Foreign Application Priority Data

Jul. 26, 1993 [KR] Rep. of Korea .................... 93-14188

[51] Int. Cl.$^6$ .............................................. H01L 21/266

[52] U.S. Cl. ........................................ 437/38; 437/228; 437/950

[58] Field of Search .................... 437/38, 73, 228, 950; 148/DIG. 144; 445/49, 50

[56] References Cited

U.S. PATENT DOCUMENTS 3,970,887 7/1976 Smith et al. ............................ 257/10
4,513,308 4/1985 Greene et al. ......................... 257/10
5,266,530 11/1993 Bagley et al. ....................... 437/228
5,358,908 10/1994 Reinberg et al. .................. 437/228

OTHER PUBLICATIONS

Jung Y. EA, et al., Silicon Avalanche Cathodes and Their Characteristics, Oct. 1991, vol. 38 pp. 2377–2382.

*Primary Examiner*—Brian E. Hearn
*Assistant Examiner*—Chandra Chaudhari
*Attorney, Agent, or Firm*—Foley & Lardner

[57] ABSTRACT

An FEA having a novel structure using an $n^+$shallow junction region, which operates with small voltages and increases emission current and a method for manufacturing the same. A tip is formed on a first conductive type semiconductor substrate, a first impurity region having a high impurity concentration is formed in the upper portion of the semiconductor substrate wherein first conductive type impurities are implanted, and a second conductive type second impurity region is formed in the surface of the semiconductor substrate around the tip and on the first impurity region. Also, a second conductive type shallow junction region is formed in the surface portion of the tip, an insulation layer including a pin hole which exposes the tip is formed on the semiconductor substrate, and a conductive layer having an opening corresponding to the pin hole of the insulation layer is formed on the insulation layer. When electrons are emitted by a tunneling effect, the required voltages to be applied are lowered. Since the tip can be manufactured by a self-aligned manner, the manufacturing process becomes simplified.

8 Claims, 3 Drawing Sheets

METHOD FOR MANUFACTURING FIELD EMITTER ARRAY

BACKGROUND OF THE INVENTION

The present invention relates to a field emitter array (FEA) and method for manufacturing the same, and more particularly, to a novel field emitter array having a shallow junction, and a method for manufacturing the same.

In response to a rapidly increasing demand for space-saving, personal displays which serve as the primary information transmission interface between humans and computers (and other types of computerized devices), various types of flat screen or flat panel displays have been developed to replace conventional display devices, particularly CRTs, which are relatively large, bulky, and obtrusive. Examples of these flat panel displays include a plasma display, liquid crystal display, fluorescent display and field emission display. Among the flat panel displays, the field emission display has been under active research, since it can be driven by a relatively low power and can easily embody color images.

The field emission display emits electrons by a field emitter array on which the cathode tips (each of which is the source of the electrical field per a unit pixel) are highly integrated, and the emitted electrons are captured on the fluorescent layer to thereby form a pixel.

The cathode tips are arranged in a closed and limited space which is maintained at a high vacuum state for enabling the electrons to be emitted easily. The cathode tips have been mainly manufactured using a metal. In recent years, there have been suggested a number of methods for manufacturing micro-tips using developments in semiconductor manufacturing technology.

For example, Smith et al. have suggested a field emission cathode structure and manufacturing method thereof by using a single crystalline semiconductor substrate, in U.S. Pat. No. 3,970,887. Also, Greene et al. have suggested an FEA having a pyramidal field emission cathode structure on a single crystalline substrate by using a p-n junction structure, in U.S. Pat. No. 4,513,308.

FIG. 1 is a cross-sectional view of the FEA disclosed by Greene et al.

Referring to FIG. 1, an insulation layer 22 having multiple pin holes is formed in a matrix pattern on a p-type semiconductor substrate 14, and an n-type pyramidal tip 16 including the p-type semiconductor substrate 14 and a p-n junction 18 is formed in the pin holes. Here, a metallic electrode 20 is formed on the insulation layer 22, and a lower electrode 28 is provided in the lower portion of semiconductor substrate 14. When a voltage 26 is applied through the metallic electrode 20 and the lower electrode 28 so that the p-n junction may be forward biased, a predetermined amount of electrons are emitted from a tip depending on the applied voltage 26. The emitted electrons are captured in a fluorescent layer (not shown), and the fluorescent layer is excited to then form a pixel.

Most current research is concentrated on a field emission device using sharp tips by which the field emission device can operate in a high voltage emission and high-temperature environment with minimal power loss. However, the device requires high applied voltages.

Meanwhile, a method for manufacturing a field emission device has been recently proposed, which can emit electrons with low applied voltages by using a shallow silicon p-n junction region without tips (see Jung Y. Ea et al., "Silicon Avalanche Cathodes and Their Characteristics," IEEE Transactions on Electron Devices, Vol. 38, No. 10, October 1991). According to the referenced thesis, electrons are emitted through an $n^+$shallow junction region by a tunneling effect. However, when an FEA is manufactured by this method, after forming an opening by a patterning method, impurities are implanted therein to form a shallow junction region, which complicates the manufacturing process. Moreover, in the case of manufacturing a cathode array in which multiple field emission devices are integrated, it is difficult to manufacture such devices so as to have consistent characteristics on a single substrate.

SUMMARY OF THE INVENTION

An object of the present invention is to provide an FEA having a novel structure using an $n^+$shallow junction region, which operates with lower voltages than a conventional FEA and increases emission current.

Another object of the present invention is to provide an FEA having a novel structure which can be manufactured easily in a self-aligned manner. Still another object of the present invention is to provide a suitable method for manufacturing the above FEA.

To accomplish the above and other objects of the present invention, the present invention is characterized in that a p-n junction structure is formed in the tip region.

Briefly, the present invention provides a microtip comprising a first conductivity type semiconductor substrate having a pyramidal tip formed thereon; a first impurity region doped with a first conductivity type impurity formed in the upper portion of the semiconductor substrate having a high impurity concentration; a second impurity region doped with a second conductivity type impurity formed in the surface portion of the semiconductor substrate around the pyramidal tip and on the first impurity region; and a shallow junction region doped with a second conductivity type impurity formed around the surface portion of the pyramidal tip.

The present invention provides a field emitter array comprising a first conductivity type semiconductor substrate having a pyramidal tip formed thereon; a first impurity region doped with a first conductivity type impurity formed in the upper portion of the semiconductor substrate having a high impurity concentration; a second impurity region doped with a second conductivity type impurity formed in the surface portion of the semiconductor substrate around the pyramidal tip and on the first impurity region; a shallow junction region doped with a second conductivity type impurity formed around the surface portion of the pyramidal tip; an insulation layer formed on the semiconductor substrate, including a pin hole which exposes the tip; and a conductive layer formed on the insulation layer, having an opening corresponding to the pin hole of the insulation layer.

To accomplish other objects of the present invention, there is provided a method for manufacturing a microtip, comprising the steps of: forming a first insulation layer pattern for forming a microtip on a first conductivity type semiconductor substrate; isotropically etching the upper portion of the semiconductor substrate using the insulation layer pattern as a mask to form an undercutting portion in the lower part of the insulation layer pattern; implanting a second conductive type impurity into the whole surface portion of the semiconductor substrate using the insulation layer pattern as a mask to form a second conductive type impurity region having a high impurity concentration in the upper portion of the semiconductor substrate; oxidizing the whole surface portion of the semiconductor substrate including the undercutting portion to form an oxide layer on the whole surface of the semiconductor substrate and an extruded tip on the semiconductor substrate; selectively removing the oxide layer formed on the surface portion of the tip to provide the oxide layer with an opening exposing the tip; and forming a shallow junction region in the surface portion of the tip.

Also, the present invention provides a method for manufacturing a field emitter array, comprising the steps of forming a first insulation layer pattern for forming a tip on a first conductivity type semiconductor substrate; isotropically etching the upper portion of the semiconductor substrate using the insulation layer pattern as a mask to form an undercutting portion in the lower part of the insulation layer pattern; implanting impurity into the whole surface portion of the semiconductor substrate using the first insulation layer pattern as a mask to form a second conductivity type impurity region having a high impurity concentration on the semiconductor substrate; oxidizing the whole surface portion of the semiconductor substrate including the undercutting portion to form an oxide layer on the whole surface of the semiconductor substrate and an extruded tip on the semiconductor substrate; laminating a second insulation layer and a conductive layer on the oxide layer around the tip and on the first insulation layer pattern; removing a portion of the oxide layer formed on the surface of the tip, the first insulation layer pattern and the second insulation layer and the conductive layer formed on the first insulation layer pattern, to expose the tip; and forming a shallow junction region in the surface portion of the exposed tip.

Since p+impurities are doped in the tip region and an n+ shallow junction region is formed on the surface thereof, thereby containing a p-n junction in the tip itself, if electrons are emitted by a tunneling effect, the required voltages to be applied may be reduced.

BRIEF DESCRIPTION OF THE DRAWINGS

The above objects and other advantages of the present invention will become more apparent by describing in detail a preferred embodiment thereof with reference to the attached drawings in which.

DETAILED DESCRIPTION OF THE INVENTION

Hereinafter, the present invention will be explained in detail with reference to the drawings.

Figure 1:
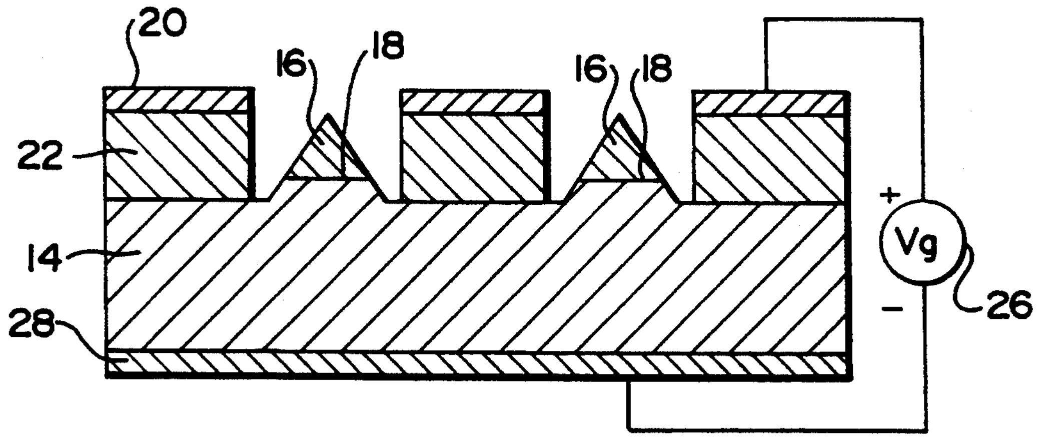
Fig- 1 (PRIOR ART)
FIG. 1 is a cross-sectional view of a conventional FEA.
Figure 2:
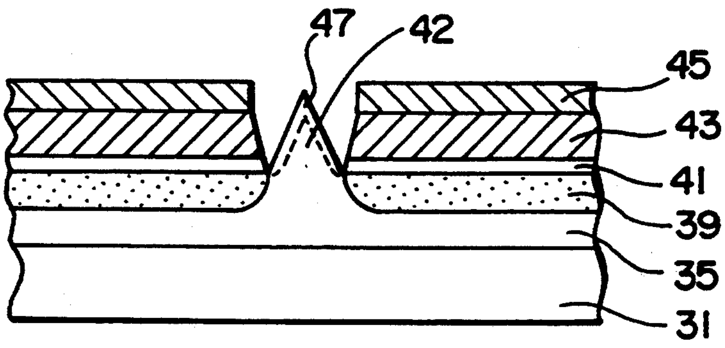
FIG. 2 is a cross-sectional view showing the structure of the microtip formed in the FEA according to one embodiment of the present invention.

FIG. 2 is a cross-sectional view showing the structure of the microtip formed in the FEA according to the present invention.

As shown in FIG. 2, the microtip 42 is formed on a first conductivity type (p-type) semiconductor substrate 31. A first conductivity type p+impurity region 35 is formed in the upper portion of the semiconductor substrate, and a second conductivity type n+impurity region 39 is formed in the surface portion around microtip 42 of semiconductor substrate 31 and on first conductivity type p+impurity region 35. The tip 42 is formed in a pyramidal shape and a shallow junction region 47 is formed in the surface portion thereof. When voltages are applied to the tip, electrons are emitted from the tip by a tunneling effect.

An oxide layer 41 having an opening exposing the tip 42 is formed around the tip forming area on semiconductor substrate 31 by oxidizing the surface portion of semiconductor substrate 31, and an insulating layer 43 having a pin hole corresponding the opening of oxide layer 41 and having a similar thickness to the height of the tip 42 is formed on oxide layer 41. A conductive layer 45 having an opening corresponding to the pin hole of insulating layer 43 is formed on the insulation layer 43.

Hereinbelow, the method for manufacturing the FEA and the microtip according to the present invention will be described in detail with reference to the accompanying drawings.

FIGS. 3 through 11 are schematic diagrams showing a method for manufacturing the microtip of the FEA according to one embodiment of the present invention.

Figure 3:
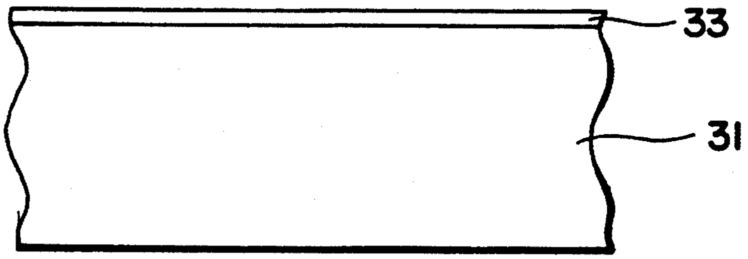
FIGS. 3 through 11 are schematic diagrams showing a method for manufacturing the microtip of the FEA according to one embodiment of the present invention.

FIG. 3 shows the step of forming a pad oxide layer 33. A thin pad oxide layer 33 having a thickness of about 500 Å is formed by thermally oxidizing the surface of a first conductive type semiconductor substrate 31.

Figure 4:
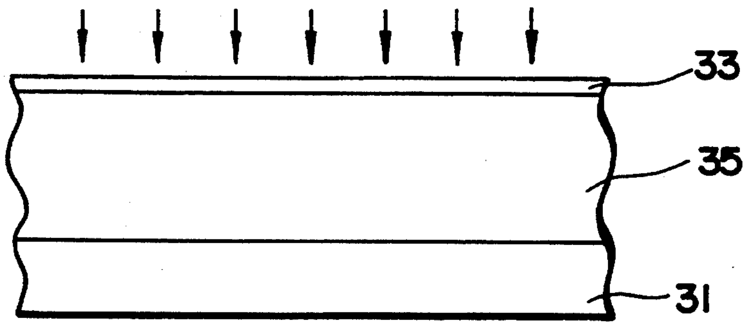

FIG. 4 shows the step of doping first conductive type (p+) impurities. A p+impurity region 35 is formed in the upper portion of semiconductor substrate 31 having the pad oxide layer 33 formed thereon by implanting an impurity such as boron, at an ion energy of 80 KeV and the dosage of $1.8\times10^{14}/cm^2$.

Figure 5:
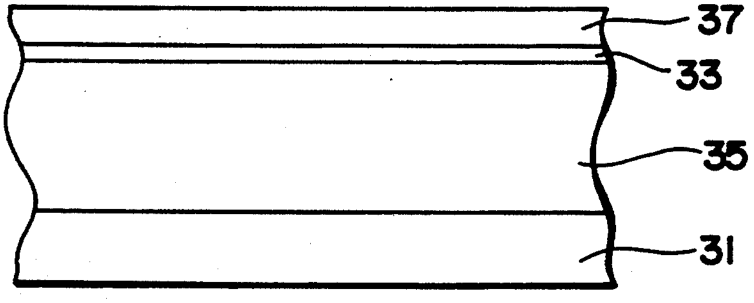

FIG. 5 shows the step of forming a first insulation layer 37. After the step shown in FIG. 4, the surface portion of semiconductor substrate 31 is oxidized, to form first insulation layer 37 comprising silicon oxide and having a thickness of about 5,000Å.

Figure 6:
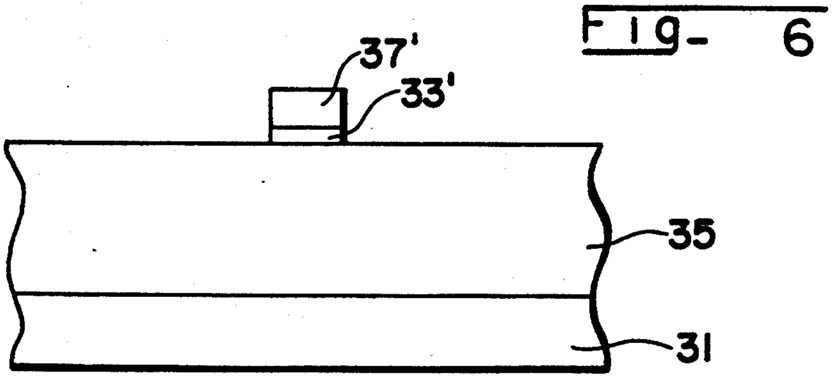

FIG. 6 shows the step of forming a first insulation layer pattern 37' by patterning first insulation layer 37. After first insulation layer 37 is formed, a photoresist is coated on first insulation layer 37 to form a photoresist layer. Thereafter, a portion of the photoresist layer for a microtip formation is selectively exposed and then the exposed photoresist layer is developed to form a dotted photoresist pattern (not shown) corresponding to the portions for microtip formation. Then, the first insulation layer 37 and the pad oxide layer 33 are anisotropically etched by using the dotted photoresist pattern as an etching mask until the surface of the semiconductor substrate 31 is exposed, to form an approximately 2 μm-dot first insulation layer pattern 37'. Here, a pad oxide layer pattern 33' is formed under first insulation layer pattern 37'. Thereafter, the remaining photoresist pattern is stripped away.

Figure 7:
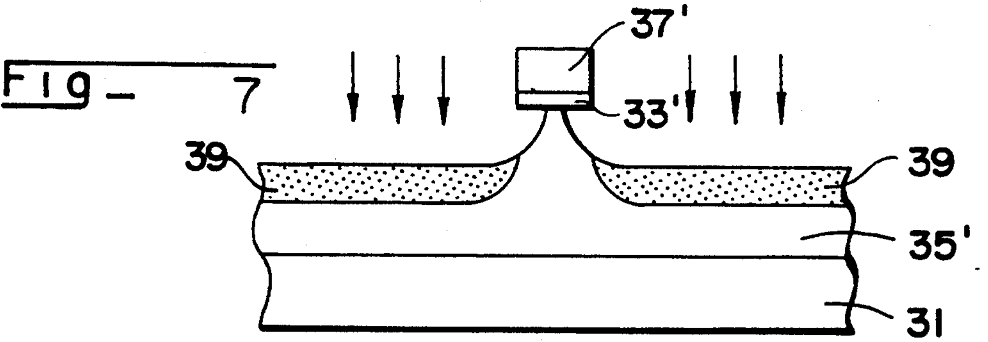

FIG. 7 shows the step of forming an undercutting portion under first insulation layer pattern 37' and forming a second conductivity type (n+) impurity region 39. In more detail, after forming first insulation layer pattern 37', the impurity region 35 in the surface portion of semiconductor substrate 31 is isotropically etched by using first insulation layer pattern 37' as an etching mask, the silicon below the dotted first insulation layer pattern 37′ is undercut at the same rate of the etching depth of the impurity region 35. Then, as shown in FIG. 7, an undercutting portion and a pyramidal or conoid silicon tip are formed under the first insulation layer pattern 37′. The etched depth of impurity region 35 is preferably about 0.8–1 μm. Here, reference numeral 35′ denotes the p+impurity region after the isotropic etching.

Next, n+ ions such as phosphorous ions are implanted throughout the whole surface of the semiconductor structure shown in FIG. 7 using first insulation layer pattern 37′ as an ion-implanting mask, thereby forming n+impurity region 39 around the tip forming region on the p+impurity region 35′.

Figure 8:
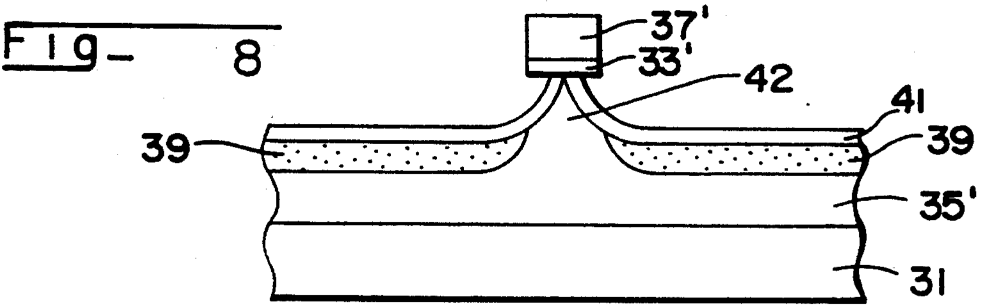

FIG. 8 shows the step of forming an oxide layer 41 and a microtip 42 by thermally oxidizing the whole surface of the semiconductor structure shown in FIG. 7. After forming n+impurity region 39, an approximately 2,000–3,000 Å thick oxide layer 41 is formed by thermal oxidation of the n+impurity region 39 and the undercutting portion of the tip 42 and at the same time a sharpened microtip 42 is formed by sharpening the silicon tip.

Figure 9:
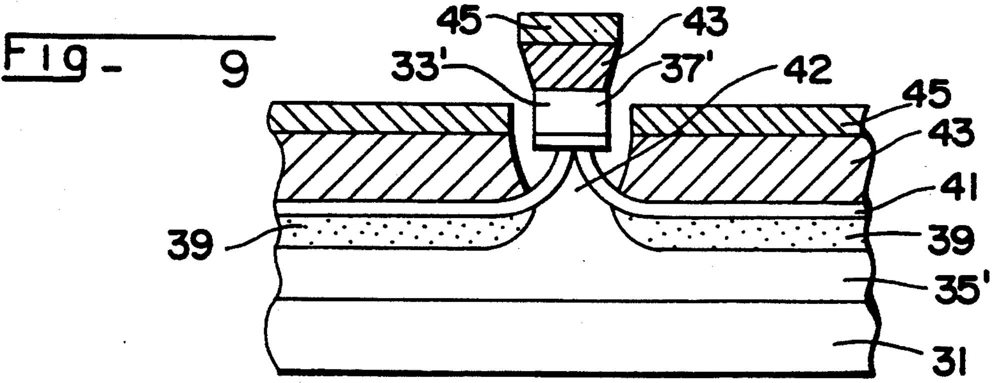

FIG. 9 shows the step of forming a second insulation layer 43 and a conductive layer 45. After the step shown in FIG. 8, an insulating material such as silicon oxide is deposited on the whole surface of the resultant product by a CVD method, a sputtering method, or other such method, thereby forming an approximately 1–2 μm thick second insulation layer 43 on first insulation layer pattern 37′. On second insulation layer 43, a conductive material such as gold (Au), molybdenum (Mo), aluminum (Al), or tungsten (W), or a semiconductor material such as polysilicon doped with an impurity is deposited, thereby forming an approximately 0.2–1.5 μm thick conductive layer 45.

Figure 10:
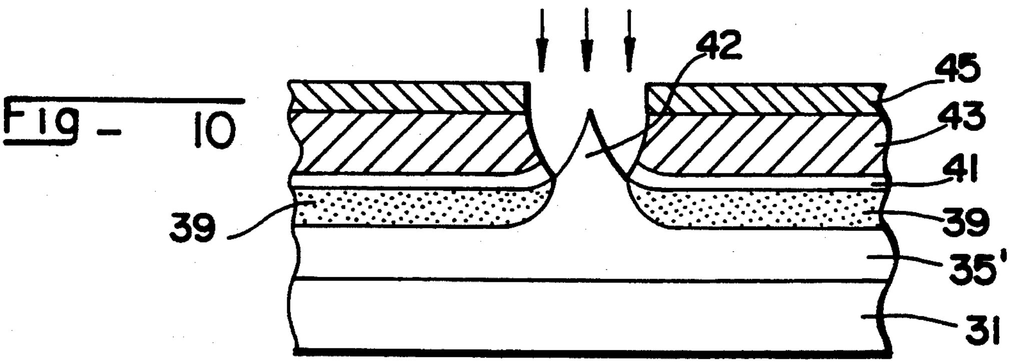

FIG. 10 shows the step of exposing the tip region and then implanting impurities to form a shallow junction region 47. The result obtained from the step of FIG. 9 is subject to a lift-off process by using an oxide etchant to selectively remove a part of oxide layer 41 formed on the surface of the tip 42. Here, the structure on the tip 42 constituted by pad oxide layer pattern 33′ formed on the tip 42, a first insulation layer pattern 37′, portions of second insulation layer 43 and conductive layer 45 formed on first insulation layer pattern 37′ are simultaneously removed, so that the tip 42 itself is exposed. Here, oxide layer 41 is provided with an opening which exposes tip 42.

Thereafter, an impurity such as arsenic is implanted through the surface of the tip at an ion energy of 20 KeV and the dosage of $1.8\times10^{14}/cm^2$, thereby forming a shallow junction region having a depth of about 0.1 μm or less in the surface portion of tip 42.

Figure 11:
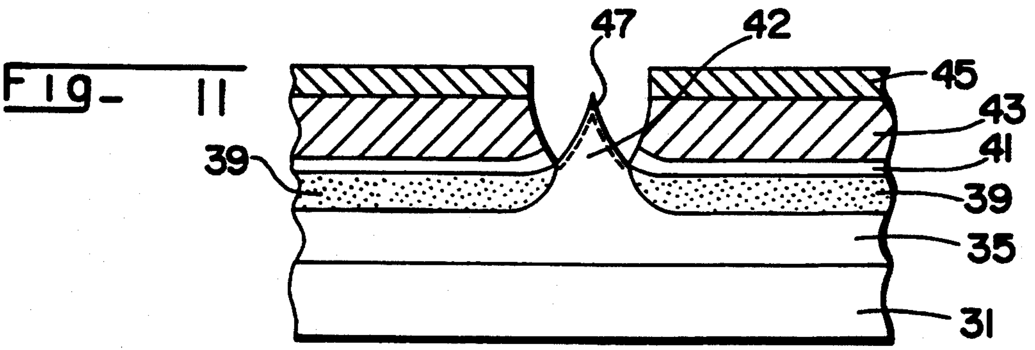

FIG. 11 shows the cross-sectional view of the finally formed microtip including the shallow junction area 47 formed as above, which is the same as that shown in FIG. 2. The FEA according to the present invention is manufactured by arranging the microtip 42 and the conductive layer 45 used as an electrode in a matrix pattern. In this manner, it is possible for anyone skilled in the art to manufacture the FEA.

As illustrated, the microtip according to present invention includes a p-n junction in itself. In other words, the tip is doped with p+impurities and a shallow junction region is formed with n+impurities in the surface portion thereof, thereby lowering the voltages required for electron emission by using a tunneling effect. Also, since the conductive layer used as an electrode and a dielectric layer is formed around the tip in a self-aligned manner by using a lift-off process and the shallow junction region is formed by an ion-implantation using a previously formed conductive layer for the electrode and an insulation layer existing under the conductive layer as an implantation mask, the process is simplified for the easy manufacture of an FEA having a microtip.

Although the present invention has been described with respect to a preferred embodiment constructed in accordance therewith, the invention is not limited by the specific embodiment herein, and variations and modifications may be made within the scope of the knowledge of one skilled in the art.

We claim:

1. A method for manufacturing a microtip, comprising the steps of:

forming a first insulation layer pattern for forming a microtip on a semiconductor substrate having a first conductivity type impurity;

isotropically etching the upper portion of said semiconductor substrate using said insulation layer pattern as a mask to form an undercutting portion in a lower portion of said insulation layer pattern;

implanting a second conductivity type impurity into a surface portion of said semiconductor substrate using said insulation layer pattern as a mask to form a second conductivity type impurity region having a high impurity concentration in an upper portion of said semiconductor substrate;

oxidizing the surface portion of said semiconductor substrate including said undercutting portion to form an oxide layer on the surface of said semiconductor substrate and an extruded tip on said semiconductor substrate;

selectively removing said oxide layer formed on a surface portion of said tip to provide said oxide layer with an opening exposing said tip; and forming a shallow junction region in the surface portion of said tip.

2. A method for manufacturing a microtip as claimed in claim 1, wherein said first insulating layer pattern forming step comprises the steps of:

thermally oxidizing the surface portion of said semiconductor substrate to form a pad oxide layer on said semiconductor substrate;

forming a first insulating layer on said pad oxide layer; and patterning said first insulating layer and said pad oxide layer to form said first insulating layer pattern and a pad oxide layer pattern.

3. A method for manufacturing a microtip as claimed in claim 1, wherein said oxide layer removing step comprises the steps of:

sequentially depositing an insulating material and a conductive material to form an insulation layer and a conductive layer on said oxide layer, said insulating layer and said conductive layer having an opening exposing a portion of said oxide layer formed on said tip; and etching the portion of said oxide layer formed on said tip using said conductive layer as a mask.

4. A method for manufacturing a microtip as claimed in claim 1, wherein said shallow junction region has a depth of 0.1 μm or less.

5. A method for manufacturing a field emitter array, comprising the steps of:

forming a first insulation layer pattern for forming a tip on a semiconductor substrate having a first conductivity type impurity;

isotropically etching an upper portion of said semiconductor substrate using said insulation layer pattern as a mask to form an undercutting portion in a lower portion of said insulation layer pattern;

implanting a second conductivity type impurity into a surface portion of said semiconductor substrate using said insulation layer pattern as a mask to form a second conductivity type impurity region having a high impurity concentration in an upper portion of said semiconductor substrate;

oxidizing the surface portion of said semiconductor substrate including said undercutting portion to form an oxide layer on the surface of said semiconductor substrate and an extruded tip on said semiconductor substrate;

laminating a second insulation layer and a conductive layer on said oxide layer around said tip and on said first insulation layer pattern;

removing a portion of said oxide layer formed on a surface of said tip, said first insulation layer pattern and portions of said second insulation layer and said conductive layer formed on the said first insulation layer pattern, to expose said tip; and forming a shallow junction region in a surface portion of said exposed tip.

6. A method for manufacturing a field emitter array as claimed in claim 5, wherein said conductive layer is formed by depositing a metal selected from the group consisting of Au, Mo, Al and W.

7. A method for manufacturing a field emitter array as claimed in claim 5, wherein said conductive layer is formed by depositing polysilicon doped with an impurity.

8. A method for manufacturing a microtip comprising the steps of:

forming a first impurity region doped with a first conductivity type impurity having a high impurity concentration, in an upper portion of a first conductivity type semiconductor substrate, said first impurity region having a tip formed thereon;

forming a second impurity region doped with a second conductivity type impurity disposed around said tip and on said first impurity region; and forming a shallow junction region doped with a second conductivity type impurity disposed in a surface portion of said tip.

* * * * *

UNITED STATES PATENT AND TRADEMARK OFFICE
CERTIFICATE OF CORRECTION

PATENT NO. : 5,420,054

DATED : May 30, 1995

INVENTOR(S) : Sun-jeong CHOI, ET AL.

It is certified that error appears in the above-identified patent and that said Letters Patent is hereby corrected as shown below:

On The Title page, item [75] Inventors should read as follows:

--Sun-jeong CHOI, Suwon; Gang-ok LEE, Suwon; Jong-deuk LEE, Seoul; Sang-jik KWON, Kyungki-do, all of the REPUBLIC OF KOREA--.

Signed and Sealed this

Third Day of September, 1996

Attest:

BRUCE LEHMAN

*Attesting Officer* *Commissioner of Patents and Trademarks*